(12) United States Patent
Adås et al.

(10) Patent No.: US 6,306,773 B1
(45) Date of Patent: Oct. 23, 2001

(54) METHOD OF PRODUCING A SEMICONDUCTOR DEVICE OF SIC

(76) Inventors: Christian Adås, Vanadisplan 1, 2TR, SE-113 31, Stockholm; Stefan Karlsson, Langelandsgatan 41, SE-164 43, Kista; Andrei Konstantinov, Snapphanevägen 130, SE-175 23, Järfälla; Christopher Harris, Organistgränd 34, SE-191 72, Sollentuna; Thomas Hörman, Helgagatan 32, SE-118 58, Stockholm, all of (SE)

( * ) Notice: Subject to any disclaimer, the term of this patent is extended or adjusted under 35 U.S.C. 154(b) by 0 days.

(21) Appl. No.: 09/496,085

(22) Filed: Feb. 1, 2000

(51) Int. Cl.[7] .................. H01L 21/302; H01L 21/461
(52) U.S. Cl. ............................................. 438/745
(58) Field of Search .................... 438/745, 746, 438/735, 737, 738

(56) References Cited

U.S. PATENT DOCUMENTS 5,464,509 * 11/1995 Micak et al. .................. 204/129.3
6,008,138 * 12/1999 Laermer et al. ................ 438/725
6,224,224 * 5/2001 Neukermans et al. .............. 445/1

OTHER PUBLICATIONS

G.L. Harris et al., J. Electrochem. Soc. USA, vol. 135 No. 2, 1988, pp. 405–407.
J.S. Shor, in Silicon Carbide, Ed: G.L. Harris Electrochemical etching of SiC, INSPEC 1995 ISBN 0–85296–870–1, pp. 141–149.

* cited by examiner

Primary Examiner—Benjamin L. Utech
Assistant Examiner—Matthew Anderson
(74) Attorney, Agent, or Firm—Dilworth & Barrese LLP

(57) ABSTRACT

The invention relates to a method for selective etching of SiC, the etching being carried out by applying a positive potential to a layer (3; 8) of p-type SiC being in contact with an etching solution containing fluorine ions and having an oxidising effect on SiC. The invention also relates to a method for producing a SiC micro structure having free hanging parts (i.e. diaphragm, cantilever or beam) on a SiC-substrate, a method for producing a MEMS device of SiC having a free hanging structure, and a method for producing a piezo-resistive pressure sensor comprising the step of applying a positive potential to a layer (8) of p-type SiC being in contact with an etching solution containing fluorine ions and having an oxidising effect on SiC.

21 Claims, 2 Drawing Sheets

METHOD OF PRODUCING A SEMICONDUCTOR DEVICE OF SiC

TECHNICAL FIELD OF THE INVENTION AND PRIOR ART

The present invention relates to a method for selective etching of SiC, a method for producing a SiC diaphragm on a SiC-substrate, a method for producing a MEMS (micro electrical mechanical system)-device of SiC having a diaphragm or cantilever structure, and a method for producing a piezo-resistive pressure sensor of SiC.

There is a great demand in for instance the automotive industry for low cost, high temperature pressure sensors that can operate in combustion engines. By accurately monitoring and controlling the pressure in the combustion chamber, the engine efficiency can be raised and the fuel consumption and pollutant emission reduced. To meet these needs, new and innovative pressure sensors for high temperature applications are being developed by various research groups around the world.

It is well known that silicon carbide (SiC) is a useful material for high temperature applications due to its unique properties, such as its wide band gap, high breakdown electric field and high electron saturation drift velocity. Furthermore, SiC exhibits excellent mechanical properties at high temperature, chemical stability and large piezo-resistive coefficients, which makes it suitable for high temperature piezo-resistive sensors. One difficulty in the production of piezo-resistive pressure sensors in SiC is the achievement of a diaphragm having the degree of accuracy necessary for accurate pressure measurements. One method for fabricating SiC-based pressure sensors utilises 3C—SiC films epitaxially grown on Si substrates, which gives a material system that combines the high temperature properties of SiC with methods for the production of diaphragms in Si. A drawback with this material system is that the junction between SiC and Si conducts leakage currents at temperatures around 300° C. Another problem is degradation of the device after a prolonged time due to thermal mismatch effects.

Another newly developed method for producing SiC-based pressure sensors comprises photo electrochemical etching of 6H—SiC. The production process begins with epitaxial growth of p-type 6H—SiC on n-type 6H—SiC wafers, followed by the epitaxial growth of n-type 6H—SiC on the p-type layer. Photo electrochemical etching is used to micromachine the n-type 6H—SiC wafer from the backside into diaphragms and also to pattern the n-type epitaxial 6H—SiC on top into piezo resistors. A drawback of this production method is that the photoelectrochemical etch process directionality is poor, making lateral dimensional control (e.g. of diaphragm size) difficult. Consequently, components produced by this method show a poor repeatability when used for pressure measurements.

Due to its unique properties, SiC is also useful as material for MEMS (micro electro mechanical system) devices of other types than pressure sensors. However, the use of SiC in MEMS applications has been limited due to the fact that it is difficult or even impossible to micromachine and treat this material by means of conventional and known processes for fabrication of for instance Si-MEMS devices. Consequently, there is a great need for an efficient process for matching SiC, allowing the fabrication of MEMS devices of SiC with a high degree of accuracy, and by means of which micro structural devices of SiC having a complex structure may be produced.

SUMMARY OF THE INVENTION

An objective of the present invention is to provide a new method for selective etching of SiC enabling the production of SiC-MEMS devices, in particular MEMS devices having free hanging structures (i.e. diaphragms, cantilevers and beams), with a high degree of accuracy.

According to the invention, this objective is achieved by applying a positive potential to a layer of p-type SiC being in contact with an etching solution containing fluorine ions and having an oxidising effect on SiC. This etching process makes it possible to etch a layer of SiC with a high degree of accuracy. Consequently, this etching process can be very useful in the production of a MEMS device.

According to a preferred embodiment of the invention, said layer of p-type SiC is part of a multilayer structure with at least two layers of SiC with substantially different nature of doping, i.e. different doping concentration and/or different doping type, n and p, so that said etching step results in an etching of said layers to an extent depending upon the nature of doping of the individual layers. In this way, a selective etching of a layer of SiC forming part of a multilayer structure of SiC can be efficiently performed and all types of micro structural designs may be obtained by varying the nature of doping and the positions of the doped regions, thereby the tendency to be etched of the different layers.

According to another preferred embodiment of the invention, the multi-layer structure comprises a first layer of p-type SiC, a second layer of p-type SiC and a third layer of n-type SiC, the p-type layer to be etched constituting said second layer and being located between the first and the third layer, said second layer having a doping concentration which is higher than the doping concentration of the first layer, and the positive potential being applied to the second layer via the first layer. The first p-type layer functions as a means for conducting the necessary current to the second p-type layer, whereas the n-type layer functions as a barrier to the current. Since the first p-type layer has a lower doping concentration than the second p-type layer, the second p-type layer will supply the greater part of the positive charges required for the etching process. During the etching process, the first p-type layer and the third n-type layer will remain almost unaffected by the etching process. Consequently, the etching process will result in a uniform and well defined inter space between the first layer and the third layer.

Another object of the invention is to provide a method for producing a free hanging structure, such as a diaphragm, cantilever or beam on a SiC-substrate with a high degree of accuracy.

According to the invention, this object is achieved in that the SiC-substrate is formed with a first layer of p-type SiC, a second layer of p-type SiC and a third layer of n-type SiC, the second layer being located between the first and the third layer, and the second layer having a doping concentration which is higher than the doping concentration of the first layer, that a passage is formed in the substrate for allowing a selective etching solution to come into contact with the second layer, that the substrate is placed in a selective etching solution containing fluorine ions and having an oxidising effect on SiC, and that a positive potential is applied to the second layer via the first layer so as to etch said second layer in the etching solution for the formation of an interspace between the first layer and the third layer, whereby said free hanging structure is formed by said third layer.

A further object of the invention is to provide an efficient and accurate method for producing a MEMS device of SiC having a free hanging structure, such as a diaphragm, cantilever or beam.

According to the invention, this object is achieved by a method comprising the following steps:

forming a first layer of p-type SiC on a substrate of p-type SiC by epitaxial growth or ion implantation, said layer being formed with a doping concentration which is higher than the doping concentration of the substrate, forming a second layer of n-type SiC on the first layer by epitaxial growth or ion implantation, forming a passage in the second layer for allowing a selective etching solution to come into contact with the first layer, placing the so formed sample in a selective etching solution containing fluorine ions and having an oxidising effect on SiC, and applying a positive potential to the first layer via the substrate so as to etch said first layer in the etching solution for the formation of an interspace between the substrate and the second layer, whereby said free hanging structure is formed by said second layer.

A further object of the invention is to provide an efficient and accurate method for producing a SiC piezo-resistive pressure sensor that can operate under hard conditions, for instance in high temperature environments.

According to the invention, this object is achieved by a method comprising the following steps:

forming a first layer of p-type SiC on a substrate of p-type SiC by epitaxial growth or ion implantation, said layer being formed with a doping concentration which is higher than the doping concentration of the substrate, forming a second layer of n-type SiC on the first layer by epitaxial growth or ion implantation, forming a passage in the second layer for allowing a selective etching solution to come into contact with the first layer, placing the so formed structure in a selective etching solution containing fluorine ions and having an oxidising effect on SiC, applying a positive potential to the first layer via the substrate so as to etch said first layer in the etching solution for the formation of an interspace between the substrate and the second layer, whereby a diaphragm is formed by said second layer, forming a third layer of SiC on the diaphragm and the exposed parts of the substrate by epitaxial growth, and etching the third layer to form a piezo resistor of the third layer material on the diaphragm and to form a sealing of the third layer material between the diaphragm and the substrate so as to seal the cavity formed between the diaphragm and the substrate.

According to a preferred embodiment of the invention, the layer to be etched has a doping concentration that is at least 10 times as high as the doping concentration of the adjacent p-type layer. In this way it is secured that in principle all the positive charges required for the etching process will be supplied by the p-type layer to be etched, whereas the other p-type layer will remain as good as unaffected throughout the etching process. It has been shown that a doping concentration $>10^{17}$ cm$^{-3}$ of the p-type layer to be etched and a doping concentration $<10^{15}$ cm$^{-3}$ of the adjacent p-type layer will give good results.

BRIEF DESCRIPTION OF THE DRAWING

With reference to the appended drawing, below follows a specific description of a preferred embodiment of the invention cited as examples.

In the drawing.

DETAILED DESCRIPTION OF A PREFERRED EMBODIMENT OF THE INVENTION

Figure 1:
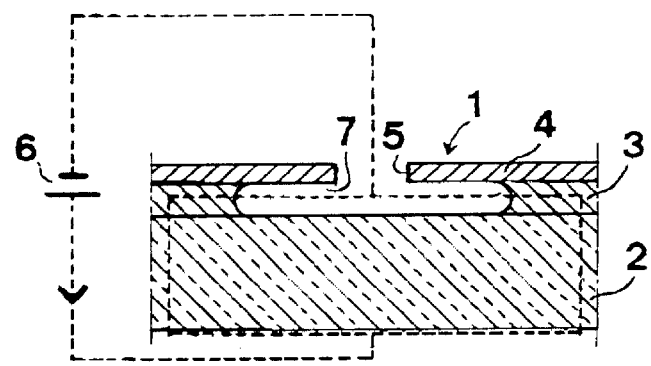
FIG. 1 is a very schematic cross-section view of a multilayer structure of SiC illustrating the etching principle according to the invention.
Figure 2:
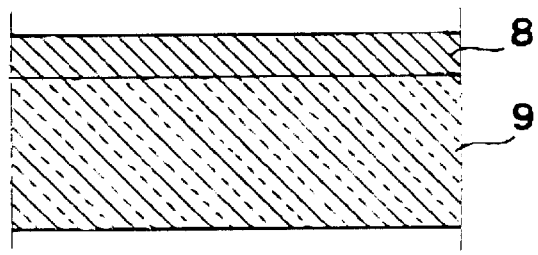
FIGS. 2, 3, 4, 5, 6, 7, 8 and 9 are schematic cross-section views illustrating different steps in the fabrication of a SiC piezo-resistive pressure sensor according to a preferred embodiment of the invention.

FIG. 1 illustrates in a schematic way a method for etching SiC according to the invention. A multilayer structure 1 of SiC, shown in cross-section in FIG. 1, comprises a first layer 2 of p-type SiC having a first doping concentration, a second layer 3 of p-type SiC being in contact with the first layer 2 and having a second doping concentration, and a third layer 4 of n-type SiC. The doping concentration of the second p-type layer 3 is higher than the doping concentration of the first p-type layer 2. The second p-type layer 3, which constitutes the p-type layer to be etched, is located between the first p-type layer 2 and the third n-type layer 4. In FIG. 1 it is schematically illustrated that an opening 5 is formed in the third layer 4 so as to make it possible to bring the second layer 3 into contact with an etching solution. The first layer 2 is connected to the anode of a source of electric current 6, schematically indicated in FIG. 1, and the multilayer structure 1 is placed in an etching solution containing fluorine ions and having an oxidising effect on SiC. The etching solution is in contact with the cathode. The electric current will flow from the first layer 2 and into the second more conductive layer 3. The third n-type layer 4 forms a barrier to the current and consequently the current will flow from the second layer 3 and into the etching solution. When the current flows from the second layer 3 and into the etching solution, which is in contact with the second layer 3 via the opening 4, the following reactions will take place:

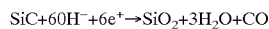

$SiC+6OH^- +6e^+ \rightarrow SiO_2 +3H_2O+CO$

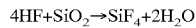

$4HF+SiO_2 \rightarrow SiF_4 +2H_2O$

In the presence of positive charges (e$^+$) SiC will react with the OH ions under formation of a layer of SiO$_2$. Note that a higher concentration of positive charges will result in faster rate of reaction, hence higher doping concentration will enhance the etch rate. The so formed SiO$_2$ will then react with fluorine ions resulting in formation of SiF$_4$, which will be dissolved into the etching solution. Since the second layer 3 of p-type SiC has a higher doping concentration than the first layer, the positive charges required for the etching process will be supplied by the second layer 3 and an etching of this second layer 3 will occur. In FIG. 1 it is shown how this etching process has dissolved parts of the second layer 3 leaving an interspace 7 between the first layer 2 and the third layer 4. As long as a current is flowing through the second layer 3 of p-type SiC, this layer supplies the positive charges required for the formation of SiO$_2$, whereas the first layer 2 of p-type SiC, through which the current flows to the second layer 3, is subjected to a very slow and practically negligible etching. The third n-type layer 4, through which no current will flow will remain unaffected during the etching process. When the second p-type layer 3 has been etched to a desired extent the supplying of electric current will be cut off and the etching process will stop.

In the example illustrated in FIG. 1, the electric current is supplied to the second p-type 3 layer via the first p-type layer 2. This is a convenient way of feeding current to the layer to be etched, since the first p-type layer 2 offers a large contact surface that can easily be connected to a source of electric current. However the necessary current may be supplied to the p-type layer to be etched in any suitable way, as long as the current is supplied to the p-type layer to be etched via a p-type material being in direct contact with said p-type layer.

The etching solution preferably consists of NH4F mixed with water. However, any solution containing fluorine ions and having an oxidising effect on SiC may be used.

FIGS. 2–9 show different steps comprised in a method according to the invention for producing a SiC piezo-resistive pressure sensor having a piezo resistor arranged on a diaphragm. In this method the etching process described above is used for formation of the diaphragm. In a first step, see FIG. 2, a layer 8 of p-type SiC is epitaxially grown or ion implanted on a substrate 9 of p-type SiC. Said layer 8 being formed with a doping concentration, which is higher than the doping concentration of the substrate 9.

Figure 3:
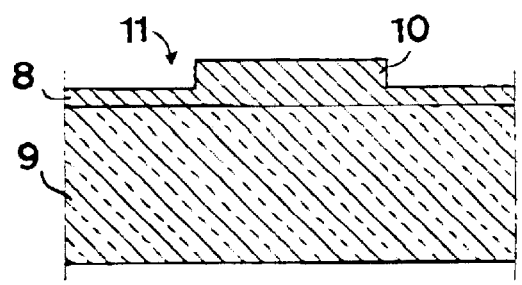

The p-type layer 8 is subjected to dry etching in order to give the layer a shape that will define the shape of the diaphragm and interspace to be produced. The size of the diaphragm to be formed will depend on the length and the width of the protruding part 10 of the p-type layer 8 formed in this dry etching process. FIG. 3 shows the piece 11 after the dry etching process.

Figure 4:
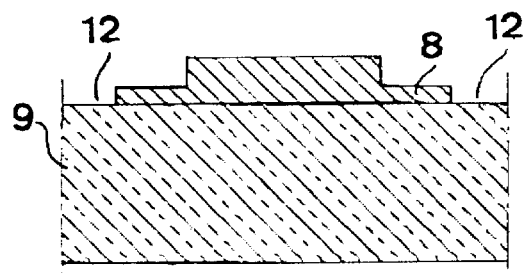

In a second dry etching step, etch channels 12 extending through the p-type layer 8 and down to the substrate 9 are formed, as illustrated in FIG. 4. The etch channels 12 may as well be arranged to extend a short distance into the substrate 9. These etch channels 12 will later be used for leading the selective etching solution to the p-type layer 8 to be etched in the subsequent electrochemical etching process.

Figure 5:
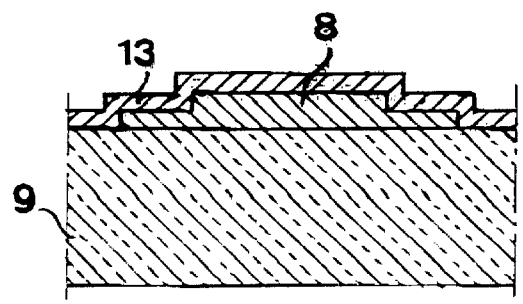

A layer 13 of n-type SiC is thereafter epitaxially grown or ion implanted on top of the p-type layer 8 and the exposed parts of the substrate 9, as illustrated in FIG. 5.

Figure 6:
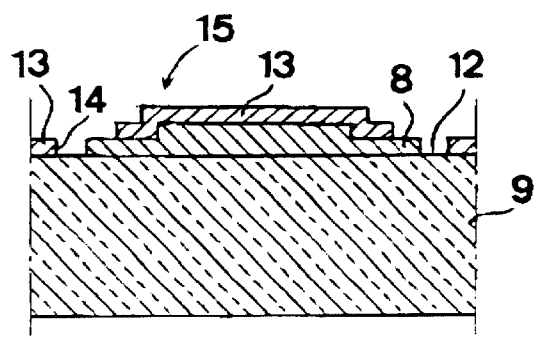

The n-type layer 13 is then subjected to a third dry etching step in order to etch away parts of the n-type layer 13 so as to form etch holes 14 reaching down to the previously formed etch channels 12. Between the etch holes 14, parts, not shown, of the n-type layer 13 extending across the etch channels 12 will be left. Via the each holes 14 and the etch channels 12 an etching solution will be able to come into contact with the p-type layer 8. The situation after this third dry etching step is illustrated in FIG. 6.

Figure 7:
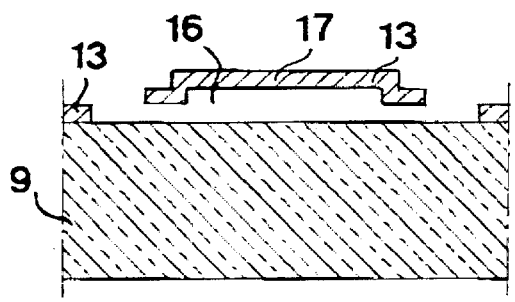

In the next step the so formed piece 15 is placed in a selective etching solution containing fluorine ions and having an oxidising effect on SiC, whereupon a positive potential is applied to the p-type layer 8 via the substrate 9. In accordance with the electrochemical etching process previously described, the p-type layer 8 will be etched, so as to completely remove this layer. When the p-type layer 8 has been etched the electric current being fed to the substrate 9 is cut off so as to avoid slow etching of the substrate 9. Consequently, an interspace in the form of a cavity 16 is formed between the substrate 9 and the n-type layer 13, as illustrated in FIG. 7. In this way a diaphragm 17 is formed of the n-type layer 13. The diaphragm 17 is fixed to the substrate 9 by means of the parts, not shown, of the n-type layer 13 extending across the etch channels 12.

Figure 8:
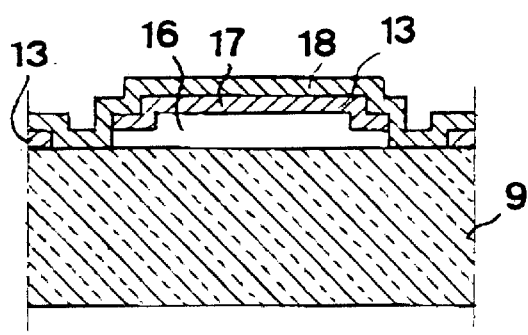
Figure 9:
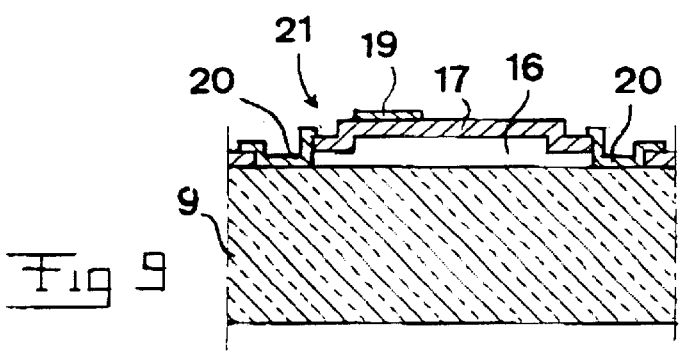

In the next step, a new layer 18 of p-type SiC, or a layer of p-type SiC with a subsequent layer of n-type SiC on top or vice versa, is epitaxially grown on the n-type layer 13 and the exposed parts of the substrate 9, as illustrated in FIG. 8.

The so formed layer 18 of p-type SiC is then subjected to dry etching in order to form a suitably sized piezo element 19 of p-type SiC on top of the diaphragm 17, and to form a sealing 20 of p-type SiC between the diaphragm 17 and the substrate 9 so as to seal the cavity 16 formed therebetween. High temperature contacts, not shown, are thereafter deposited on the device 21 so as to form means for connecting the piezo element 19 of the so formed pressure sensor to suitable electronic equipment. The diaphragm 17 of n-type SiC will function as a barrier to currents running through the piezo resistor 19 of p-type SiC when the pressure sensor 21 is being used.

Above, a method for the production of pressure sensors has been illustrated. A similar method can of course also be used for producing other types of SiC-MEMS devices having complex microstructure design. The illustrated method can for instance be used for producing SiC accelerometers, in which case no sealing will be formed between the diaphragm and the substrate in the last method step illustrated above. The described method can, of course, also be used for producing SiC-MEMS devices having other types of free hanging structures than diaphragms, e.g. cantilevers or beams. The expression "free hanging structure" here refers to a structure being positioned above an underlying part of the device and supported in at least one point in such a way that an interspace is provided between the structure and said underlying part. Said interspace may for instance contain a fluid or vacuum.

The higher the difference in the doping concentrations between the p-type layer 3,8 to be etched in the electrochemical etching process and the adjacent p-type layer 2,9, the better selectivity in the etching process. Consequently, the best results, i.e. the best selectivity, will be obtained when the p-type layer 3,8 to be etched has a doping concentration which is as high as possible, whereas the substrate 2,9 has a doping concentration which is as low as possible. However, in the example shown, the doping concentration of the substrate 2,9 must be high enough for allowing electric current to flow therethrough. It has been shown that the doping concentration of the p-type layer 3,8 to be etched should be at least 10 times as high as the doping concentration of the underlying substrate 2,9 in order to achieve that in principle only the higher doped layer 3,8 will be etched in the described electrochemical etching process, whereas the substrate 2,9 will remain essentially unaffected. Preferably, the doping concentration of the p-type layer 3,8 to be etched should be at least 100 times as high as the doping concentration of the substrate 2,9. It has also been shown that the doping concentration of the p-type layer 3,8 to be etched should preferably be $10^{17}$ cm$^{-3}$ or higher, whereas the doping concentration of the underlying substrate 2,9 should preferably be $10^{16}$ cm$^{-3}$ or lower.

In the embodiment described above the layers and the substrate are preferably of 6H—SiC, but a semiconductor device could as well be produced of 3C—SiC, 4H—SiC, 15R—SiC or any other polytype of SiC according to the disclosed method. A combination of layers of different types of SiC would also be possible. 6H—SiC is preferred since this material has a high piezo-resistive coefficient and a wider bandgap than 3C—SiC. Furthermore, 6H—SiC can be epitaxially grown with a higher degree of uniformity on etched trenches due to smaller off-axis angle.

The invention is not in any way restricted to the preferred embodiment described above, but many possibilities to modifications thereof would be apparent to a man with ordinary skill in the art without departing from the basic idea of the invention as defined in the appended claims.

The definition layer is to be interpreted broadly and comprises all types of volume extensions and shapes.

"P-type layer" does not exclude the presence of donors in that layer, but the acceptors are in majority. The acceptors used for the p-type layers of SiC may typically be Al or B, whereas N or P is some of the candidates for the donors of the n-type layer.

When a new layer is said to be formed "on" a previous layer by ion implantation it is realized that no new material is added to the structure and that the new layer is formed of material, which before the formation of the new layer constituted an upper part of the previous layer.

What is claimed is:

1. A method for selective etching of SiC, characterised in that the etching is carried out by applying a positive potential to a layer (3; 8) of p-type SiC being in contact with an etching solution containing fluorine ions and having an oxidising effect on SiC.

2. A method according to claim 1, characterized in that said layer (3; 8) is part of a multi-layer structure with at least two layers of SiC with different nature of doping, i.e. different doping concentration and/or different doping type, n and p, so that said etching step results in an etching of said layers to an extent depending upon the nature of doping of the individual layers.

3. A method according to claim 2, characterized in that the multi-layer structure comprises a first layer (2; 9) of p-type SiC, a second layer (3; 8) of p-type SiC and a third layer (4; 13) of n-type SiC, the p-type layer to be etched constituting said second layer (3; 8) and being located between the first and the third layer (2, 4; 9, 13), said second layer (3; 8) having a doping concentration which is higher than the doping concentration of the first layer (2; 9), and the positive potential being applied to the second layer (3; 8) via the first layer (2; 9).

4. A method according to claim 3, characterized in that the second layer (3; 8) has a doping concentration which is at least ten times as high as the doping concentration of the first layer (2; 9).

5. A method according to claim 4, characterized in that the second layer (3; 8) has a doping concentration $>10^{17}$ cm$^{-3}$.

6. A method according to claim 3, characterized in that the first layer (2; 9) and/or the second layer (3; 8) and/or the third layer (4; 13) is/are of 6H—SiC.

7. A method according to claim 2 wherein the at least two layers of SiC possess different doping concentration and/or doping type.

8. A method according to claim 1, characterized in that the etching solution consists of a mixture of NH$_4$F and water.

9. A method for producing a micro structure containing a free hanging structure, such as a diaphragm, cantilever or beam, on a SiC-substrate comprising layers of SiC, characterised in that the SiC-substrate is formed with a first layer (2; 9) of p-type SiC, a second layer of p-type SiC and a third layer (4; 13) of n-type SiC, the second layer (3; 8) being located between the first and the third layer (2, 4; 9, 13), and the second layer (3; 8) having a doping concentration which is higher than the doping concentration of the first layer (2; 9), that a passage (5; 12, 14) is formed in the substrate for allowing a selective etching solution to come into contact with the second layer (3; 8), that the substrate is placed in a selective etching solution containing fluorine ions and having an oxidising effect on SiC, and that a positive potential is applied to the second layer (3; 8) via the first layer (2; 9) so as to etch said second layer (3; 8) in the etching solution for the formation of an interspace (7; 16) between the first layer (2; 9) and the third layer (4; 13), whereby said free hanging structure (17) is formed by said third layer (4; 13).

10. A method according to claim 9, characterized in that the second layer (3; 8) has a doping concentration which is at least ten times as high as the doping concentration of the first layer (2; 9).

11. A method for producing a piezo-resistive pressure sensor, characterized in that the method comprises the following steps:

forming a first layer (8) of p-type SiC on a substrate (9) of p-type SiC by epitaxial growth or ion implantation, said layer (8) being formed with a doping concentration which is higher than the doping concentration of the substrate (9), forming a second layer (13) of n-type SiC on the first layer (8) by epitaxial growth or ion implantation, forming a passage (12, 14) in the second layer (13) for allowing a selective etching solution to come into contact with the first layer (8), placing the so formed structure (15) in a selective etching solution containing fluorine ions and having an oxidising effect on SiC, applying a positive potential to the first layer (8) via the substrate so as to etch said first layer in the etching solution for the formation of an interspace (16) between the substrate (9) and the second layer (13), whereby a diaphragm (17) is formed by said second layer (13), forming a third layer (18) of SiC on the diaphragm (17) and the exposed parts of the substrate (9) by epitaxial growth, and etching the third layer (18) to form a piezo resistor (19) of the third layer material on the diaphragm (17) and to form a sealing (20) of the third layer material between the diaphragm (17) and the substrate (9) so as to seal the cavity (16) formed between the diaphragm (17) and the substrate (9).

12. A method according to claim 11, characterized in that the third layer (18) is of p-type SiC or contains a combination of p-type and n-type layers of SiC.

13. A method for producing a MEMS device of SiC having a free hanging structure, such as a diaphragm, cantilever or beam, characterised in that the method comprises the following steps:

forming a first layer (8) of p-type SiC on a substrate (9) of p-type SiC by epitaxial growth or ion implantation, said layer (8) being formed with a doping concentration which is higher than the doping concentration of the substrate (9), forming a second layer (13) of n-type SiC on the first layer (8) by epitaxial growth or ion implantation, forming at least one passage (12, 14) in the second layer (13) for allowing a selective etching solution to come into contact with the first layer (8), placing the so formed sample (15) in a selective etching solution containing fluorine ions and having an oxidising effect on SiC, and applying a positive potential to the first layer (8) via the substrate (9) so as to etch said first layer (8) in the etching solution for the formation of an interspace (16) between the substrate (9) and the second layer (13), whereby said free hanging structure (17) is formed by said second layer (13).

14. A method according to claim 13, characterized in that the first layer (8) is formed with a doping concentration which is at least ten times as high as the doping concentration of the substrate (9).

15. A method according to claim 14, characterized in that the first layer (8) is formed with a doping concentration $>10^{17}$ cm$^{-3}$.

16. A method according to claim 13, characterized in that before the formation of the second layer (13) on the first layer (8), the first layer (8) is subjected to etching so as to form a protruding part (10) of the first layer material, said protruding part (10) defining the shape of the diaphragm (17).

17. A method according to claim 13, characterized in that the substrate (9) and/or the first layer (8) and/or the second layer (13) and/or the third layer (18) is/are formed of 6H—SiC.

18. A method according to claim 13, characterized in that the passage (12, 14) in the second layer (13) is formed by dry etching.

19. A method according to claim 13, characterized in that after the electrochemical etching of the first layer (8), a third layer (18) of SiC is formed on the second layer (13) by epitaxial growth or ion implantation, said third layer (18) being subjected to etching to form a piezo element (19) of the third layer material on the free hanging structure (17) and/or to form a sealing (20) of the third layer material between the free hanging structure (17) and the substrate (9) so as to seal the cavity (16) formed between the free hanging structure (17) and the substrate (9).

20. A method according to claim 19, characterized in that the third layer (18) is of p-type SiC or contains a combination of p-type and n-type layers of SiC.

21. A method according to claim 19, characterized in that the piezo resistor (19) and/or the seal (20) is formed of the third layer (18) by dry etching.

* * * * *